(12) United States Patent
Matsuoka et al.

(10) Patent No.: US 12,394,957 B2
(45) Date of Patent: Aug. 19, 2025

(54) LASER DIODE DRIVE CIRCUIT

(71) Applicant: Murata Manufacturing Co., Ltd., Nagaokakyo (JP)

(72) Inventors: Takahiro Matsuoka, Nagaokakyo (JP); Naomi Takimoto, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 785 days.

(21) Appl. No.: 17/657,144

(22) Filed: Mar. 30, 2022

(65) Prior Publication Data

US 2022/0224075 A1    Jul. 14, 2022

Related U.S. Application Data

(63) Continuation of application No. PCT/JP2020/023943, filed on Jun. 18, 2020.

(30) Foreign Application Priority Data

Sep. 30, 2019 (JP) ................................ 2019-180617

(51) Int. Cl.
*H01S 5/042* (2006.01)
*H01S 5/40* (2006.01)
*H03K 17/687* (2006.01)
*G01S 7/484* (2006.01)

(52) U.S. Cl.
CPC .......... *H01S 5/0428* (2013.01); *H01S 5/4025* (2013.01); *H03K 17/6871* (2013.01); *G01S 7/484* (2013.01)

(58) Field of Classification Search
CPC ...... H01S 5/0428; H01S 5/042; H01S 5/4025; H01S 5/06226; H01S 5/06216; H05B 45/32; H05B 45/00; H05B 45/30
See application file for complete search history.

(56) References Cited

U.S. PATENT DOCUMENTS

| 9,368,936 | B1 | 6/2016 | Lenius et al. |
| 10,989,813 | B2 | 4/2021 | Niimura |
| 2003/0016711 | A1 | 1/2003 | Crawford |

(Continued)

FOREIGN PATENT DOCUMENTS

| JP | S6234454 U | 2/1987 |
| JP | 2009170870 A | 7/2009 |

(Continued)

OTHER PUBLICATIONS

International Search Report issued in PCT/JP2020/023943, dated Sep. 15, 2020.

*Primary Examiner* — Tod T Van Roy
*Assistant Examiner* — Delma R Forde
(74) *Attorney, Agent, or Firm* — ArentFox Schiff LLP (57) ABSTRACT

A laser diode drive circuit is provided includes one or more laser diodes, a driving switching element that switches between a state in which a current is supplied to the one or more laser diodes and a state in which the current is not supplied, a driving capacitor that supplies a current to the one or more laser diodes, a drive circuit, and a boot strap circuit that supplies a voltage to the drive circuit. The boot strap circuit includes a capacitor and an inductor that suppresses a flow of a current that flows to the capacitor and to the one or more laser diodes connected in parallel during charging of the capacitor.

20 Claims, 8 Drawing Sheets

(56) References Cited

U.S. PATENT DOCUMENTS

| | | | |
|---|---|---|---|
| 2009/0161710 A1 | 6/2009 | Hoashi et al. | |
| 2017/0085057 A1 | 3/2017 | Barnes et al. | |
| 2018/0188360 A1* | 7/2018 | Berger | G01S 7/497 |
| 2019/0227170 A1 | 7/2019 | Niimura | |
| 2020/0178361 A1 | 6/2020 | Oka | |
| 2022/0224076 A1* | 7/2022 | Ando | H01S 5/0428 |
| 2022/0376472 A1* | 11/2022 | Ando | G01S 7/484 |
| 2023/0371146 A1* | 11/2023 | Ando | H05B 45/40 |
| 2024/0195147 A1* | 6/2024 | Zeng | H01S 5/0428 |

FOREIGN PATENT DOCUMENTS

| | | |
|---|---|---|
| JP | 2016127214 A | 7/2016 |
| JP | 2016152336 A | 8/2016 |
| WO | 2018066612 A1 | 4/2018 |

* cited by examiner

LASER DIODE DRIVE CIRCUIT

CROSS REFERENCE TO RELATED APPLICATIONS

The present application is a continuation of PCT/JP2020/023943 filed Jun. 18, 2020, which claims priority to Japanese Patent Application No. 2019-180617, filed Sep. 30, 2019, the entire contents of each of which are incorporated herein by reference.

TECHNICAL FIELD

The present disclosure relates to a laser diode drive circuit.

BACKGROUND

Light detection and ranging (LiDAR) has recently be used for an automobile system or a weather observation system. The LiDAR refers to a system that analyzes a distance to a remote object or a property of the object by irradiating the object with light (e.g., a pulse of light) from a laser diode that emits pulsed light and measuring light scattered by the object.

Various laser diode drive circuits that can be used for the LiDAR have been developed, for example, in Japanese Patent Laying-Open No. 2016-152336 (hereinafter "PTL 1") and Japanese Patent Laying-Open No. 2009-170870 (hereinafter "PTL 2"). PTL 1 discloses a laser diode drive circuit including a series circuit in which a direct-current (DC) power supply, an inductor, a current backflow prevention element, a capacitor, and a laser diode are connected in series. Moreover, the laser diode emits light by using an emission current from the capacitor, a switching element, and a control circuit. The switching element in PTL 1 has one end connected between the current backflow prevention element and the capacitor, and switches a current that flows to the inductor based on ON and OFF states controlled by the control circuit.

PTL 2 discloses a configuration in which a switching element for charging has a drain electrode connected to an anode side of each laser diode and has a source electrode connected a power supply. In PTL 2, a switching element for driving has a drain electrode connected to a cathode side of each laser diode, and a capacitor is connected between the anode of each laser diode and a GND line.

In the configuration in PTL 1, however, in driving a plurality of laser diodes, irradiation with short pulses of light by sequential light emission from the plurality of laser diodes cannot be carried out, and a circuit configuration for individually controlling the plurality of laser diodes cannot be adopted.

In addition, in the configuration in PTL 2, when switching between on and off states of a switching element corresponding to one laser diode is made in order to drive the same, a current flows also to another laser diode through a parasitic capacitance that exists between the drain electrode and the source electrode of the switching element and that laser diode emits light. Therefore, in the configuration in PTL 2, a laser diode may emit light at timing when light emission is not desired.

SUMMARY OF THE INVENTION

Accordingly, the present disclosure provides a laser diode drive circuit configured for individually having only a laser diode desired to emit light at timing when light emission therefrom is desired.

In an exemplary aspect, a laser diode drive circuit is provided that includes at least one laser diode, a driving switching element connected in series to an anode side of the laser diode, with the driving switching element switching between an ON state in which a current is supplied to the laser diode and an OFF state in which the current is not supplied, a driving capacitor having one end connected to the driving switching element, with the driving capacitor supplying a current to the laser diode, a drive circuit that drives the driving switching element, and a boot strap circuit that supplies a voltage for driving the driving switching element to the drive circuit. The boot strap circuit includes a capacitor connected to the drive circuit and has one end connected to a source electrode of the driving switching element and another end connected to a gate electrode of the driving switching element, Moreover, the capacitor is charged with prescribed charges, and a current suppression element connected to the one end of the capacitor suppresses a flow of a current that flows to the capacitor and to the laser diode connected in parallel during charging of the capacitor.

According to the exemplary aspect of the present disclosure, when a laser diode having a cathode connected is driven, undesired light emission from a laser diode at timing when light emission therefrom is prevented.

DETAILED DESCRIPTION OF EMBODIMENTS

Each embodiment will be described in detail below with reference to the drawings. The same or corresponding elements in the drawings have the same reference characters allotted and description thereof will not be repeated.

First Exemplary Embodiment

Figure 1:
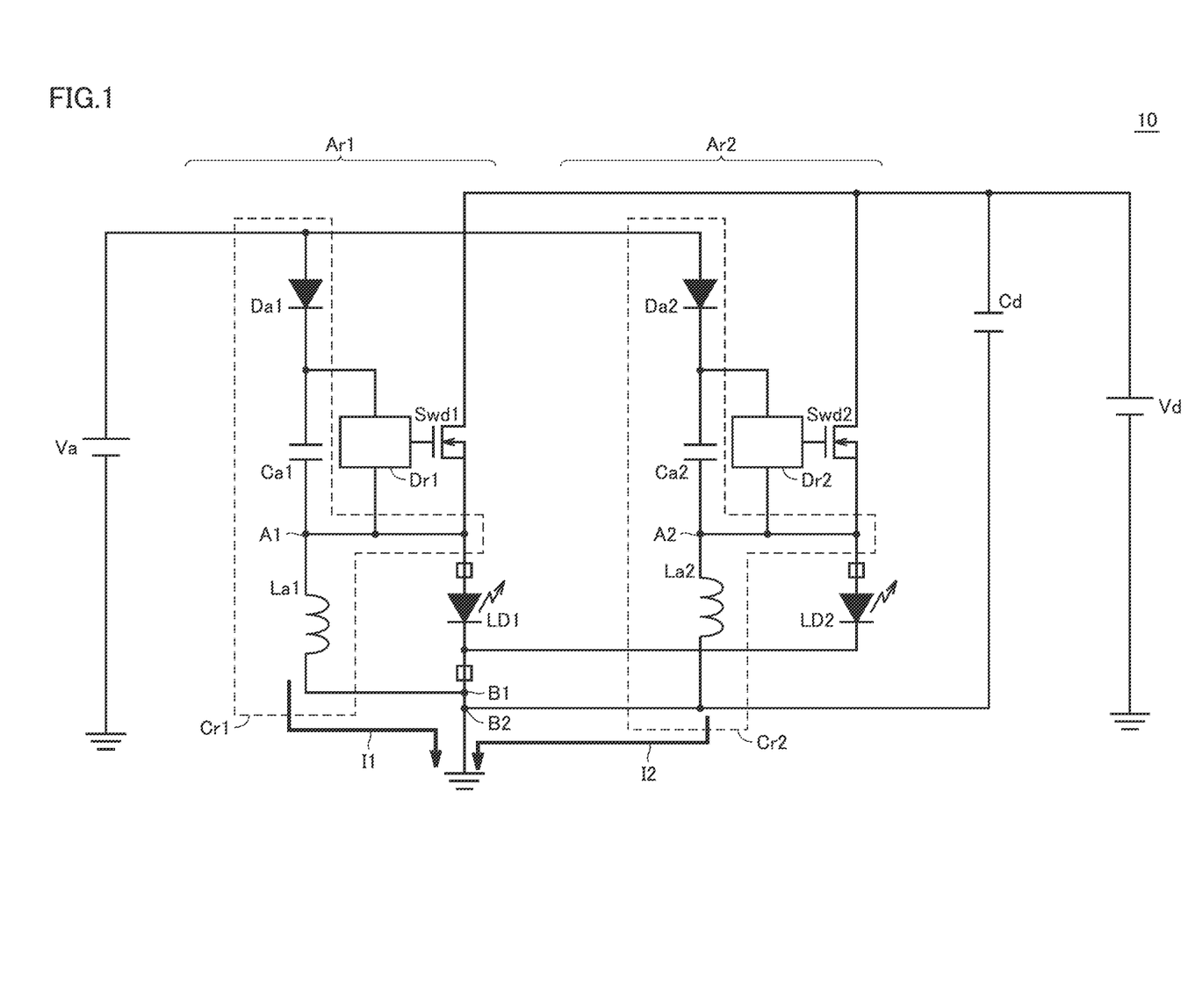
FIG. 1 is a circuit diagram showing a laser diode drive circuit in a first exemplary embodiment.

A laser diode drive circuit in a first exemplary embodiment will be described with reference to FIG. 1. As shown, FIG. 1 is a circuit diagram showing a laser diode drive circuit 10 in the first embodiment. Laser diode drive circuit 10 is adopted in a system that provides short pulses of light, such as light detection and ranging (LiDAR), and drives laser diodes LD1 and LD2. Though the laser diode drive circuit that drives two laser diodes is described in the embodiment below, without being limited thereto, the laser diode drive circuit may be configured to drive a single laser diode or three or more laser diodes in alternative embodiments.

Moreover, laser diode drive circuit 10 includes laser diodes LD1 and LD2, a driving power supply Vd, a driving capacitor Cd, driving switching elements Swd1 and Swd2, drive circuits Dr1 and Dr2, boot strap circuits Cr1 and Cr2, and a drive circuit power supply Va.

Laser diode LD1, driving switching element Swd1, drive circuit Dr1, and boot strap circuit Cr1 form an arm Ar1, and laser diode LD2, driving switching element Swd2, drive circuit Dr2, and boot strap circuit Cr2 form an arm Ar2. Though two laser diodes (laser diodes LD1 and LD2) are connected to laser diode drive circuit 10, at least one laser diode should only be connected and an arm is provided for each connected laser diode in the exemplary aspect.

In operation, laser diodes LD1 and LD2 emit light by receiving a current supplied from driving capacitor Cd. Timing of light emission from laser diodes LD1 and LD2 is controlled by driving switching elements Swd1 and Swd2. Driving switching elements Swd1 and Swd2 can have laser diodes LD1 and LD2 emit short pulses of light by switching between an ON state and an OFF state at a high speed. Laser diodes LD1 and LD2 have anodes connected to source electrodes of driving switching elements Swd1 and Swd2, respectively, and have cathodes connected the ground.

Driving power supply Vd is a DC power supply. Driving power supply Vd supplies a current to driving capacitor Cd.

Charges supplied from driving power supply Vd are stored in driving capacitor Cd, which supplies the current to laser diodes LD1 and LD2. Driving capacitor Cd is provided between driving power supply Vd and the ground. Driving capacitor Cd has one end connected to first ends of driving switching elements Swd1 and Swd2.

Driving switching elements Swd1 and Swd2 switch between the ON state in which the current is supplied to laser diodes LD1 and LD2 and the OFF state in which the current is not supplied. In exemplary aspects, driving switching elements Swd1 and Swd2 are N-type switching elements, such as a MOSFET or a GaN FET, and connected in series to anode sides of respective laser diodes LD1 and LD2. Though driving switching elements Swd1 and Swd2 may be P-type switching elements, by adopting the N-type switching elements, a high current to be fed to laser diodes LD1 and LD2 can be switched fast.

Drive circuits Da and Dr2 control switching between the ON state and the OFF state of driving switching elements Swd1 and Swd2 based on input control signals from LiDAR where laser diode drive circuit 10 is employed. When drive circuits Da and Dr2 receive an ON signal, they switch driving switching elements Swd1 and Swd2 to the ON state, and when they receive an OFF signal, they switch driving switching elements Swd1 and Swd2 to the OFF state.

Charges supplied from drive circuit power supply Va (DC power supply) are stored in boot strap circuits Cr1 and Cr2, and boot strap circuits Cr1 and Cr2 supply voltages necessary for driving the driving switching elements Swd1 and Swd2 to drive circuits Da and Dr2, respectively. Driving switching elements Swd1 and Swd2 are thus driven. Boot strap circuits Cr1 and Cr2 include current backflow prevention elements Da1 and Da2, capacitors Ca1 and Ca2, and inductors La1 and La2, respectively.

In the exemplary aspect as shown, current backflow prevention elements Da1 and Da2 are diodes that prevent a current from flowing toward drive circuit power supply Va.

Moreover, charges supplied from drive circuit power supply Va are stored in capacitors Ca1 and Ca2, and capacitors Ca1 and Ca2 supply voltages necessary for driving the driving switching elements Swd1 and Swd2 to drive circuits Dr1 and Dr2, respectively. Capacitors Ca1 and Ca2 are charged while driving switching elements Swd1 and Swd2 are in the OFF state. Capacitors Ca1 and Ca2 are connected to drive circuits Dr1 and Dr2 having first one ends connected to source electrodes of driving switching elements Swd1 and Swd2 and having the other (or second) ends connected to gate electrodes of driving switching elements Swd1 and Swd2, respectively.

When laser diodes LD1 and LD2 are controlled to emit short pulses of light, switching between the ON state and the OFF state of driving switching elements Swd1 and Swd2 is made at a high speed. Therefore, a voltage and a current at a high frequency are applied to laser diodes LD1 and LD2. When laser diodes LD1 and LD2 are controlled to emit short pulses of light, however, with inductors La1 and La2 that function to cut off a current at a high frequency, a current does not flow to inductors La1 and La2. Since the current that flows to capacitors Ca1 and Ca2 during charging of capacitors Ca1 and Ca2 is a current at a low frequency, the current flows to inductors La1 and La2 but does not flow to laser diodes LD1 and LD2. In other words, inductors La1 and La2 operate as current suppression elements that suppress a flow of the current that flows to capacitors Ca1 and Ca2 to laser diodes LD1 and LD2 during charging of capacitors Ca1 and Ca2. Inductors La1 and La2 have first ends connected to ends of capacitors Ca1 and Ca2 and connected in parallel to laser diodes LD1 and LD2, respectively.

Specifically, in laser diode drive circuit 10, a frequency (e.g., a pulse frequency) of the current that flows to laser diodes LD1 and LD2 is within a range not lower than 100 MHz and not higher than 1 GHz and a frequency (e.g., an emission frequency) of the current that flows to capacitors Ca1 and Ca2 is not higher than 500 kHz. In laser diode drive circuit 10, at the pulse frequency of laser diodes LD1 and LD2, absolute values of impedances of laser diodes LD1 and LD2 (an impedance of a path including laser diodes LD1 and LD2 between points of connection A1 and A2 and points of connection B1 and B2) are configured to be smaller than impedance values of inductors La1 and La2. Inductances L of inductors La1 and La2 have a value within a range where an amount of charges released from capacitors Ca1 and Ca2 can be provided within a time period of one cycle at an emission frequency fsw (a reciprocal of a cycle of emission of pulses of light). Inductances L of inductors La1 and La2 have a value at which the current that flows to laser diodes LD1 and LD2 during charging of capacitors Ca1 and Ca2 is smaller than an amount of the current necessary for light emission from laser diodes LD1 and LD2.

According to an exemplary aspect, L represents inductances of inductors La1 and La2, fld represents a pulse frequency of pulses of light emitted from laser diodes LD1 and LD2, fsw represents an emission frequency of emission of pulses of light from laser diodes LD1 and LD2, and Zld represents impedances of laser diodes LD1 and LD2. For purposes of this disclosure, pulse frequency fld is defined as a ½ cycle of a sin wave of pulses of light emitted from laser diodes LD1 and LD2. Emission frequency fsw is defined, with an interval of pulses of light emitted from laser diodes LD1 and LD2 being defined as one cycle. Impedance Zld is defined as an impedance of a path including laser diodes LD1 and LD2 between points of connection A1 and A2 shown in FIG. 1 to points of connection B1 and B2 shown in FIG. 1. Naturally, so long as the impedances of laser diodes LD1 and LD2 themselves are higher than impedances of other components, the impedances of laser diodes LD1 and LD2 themselves can be defined as impedance Zld.

Inductances L of inductors La1 and La2 and impedances Zld of laser diodes LD1 and LD2 satisfy relation in an expression 1 below:

$$|Zld| < 2\pi fld \times L \quad \text{(Expression 1)}$$

With such frequency characteristics of inductors La1 and La2, during charging of capacitors Ca1 and Ca2, currents I1 and I2 flow from drive circuit power supply Va through current backflow prevention elements Da1 and Da2, capacitors Ca1 and Ca2, and inductors La1 and La2 to the ground and does not flow to laser diodes LD1 and LD2.

In addition, with such frequency characteristics of inductors La1 and La2, while laser diodes LD1 and LD2 are driven, the current flows from driving capacitor Cd through driving switching elements Swd1 and Swd2 to laser diodes LD1 and LD2, but does not flow to inductors La1 and La2.

Thus, during charging of capacitors Ca1 and Ca2 (i.e., while driving switching elements Swd1 and Swd2 are in the OFF state), the current flows to inductors La1 and La2 and substantially no voltage is applied across the anode and the cathode of each of laser diodes LD1 and LD2. Therefore, laser diodes LD1 and LD2 do not emit light in this state. Thus, light emission from laser diodes LD1 and LD2 at timing when light emission is not desired is also suppressed.

In addition, during charging of capacitors Ca1 and Ca2 (i.e., while driving switching elements Swd1 and Swd2 are in the OFF state), the current flows to inductors La1 and La2 and substantially no voltage is applied across the anode and the cathode of each of laser diodes LD1 and LD2. Therefore, a voltage substantially as high as drive circuit power supply Va is applied across opposing ends of each of capacitors Ca1 and Ca2. A high voltage necessary for driving the driving switching elements Swd1 and Swd2 can thus be secured. Therefore, when driving switching elements Swd1 and Swd2 are set to the ON state, a high current can abruptly flow to laser diodes LD1 and LD2.

While laser diodes LD1 and LD2 are driven (i.e., driving switching elements Swd1 and Swd2 are in the ON state), the current flows from driving capacitor Cd through driving switching elements Swd1 and Swd2 to laser diodes LD1 and LD2, and does not flow to inductors La1 and La2.

Laser diodes LD1 and LD2 emit light by switching of driving switching elements Swd1 and Swd2 from the OFF state to the ON state. Thus, by switching the driving switching element corresponding to the laser diode desired to emit light at timing when light emission therefrom is desired from the OFF state to the ON state, the laser diode desired to emit light at timing when light emission therefrom is desired can individually be controlled to emit light.

A modification of the first embodiment will be described with reference to FIGS. 2 to 4. In general, it is noted components similar to those in the first embodiment have the same reference characters allotted and description thereof will not be repeated.

Figure 2:
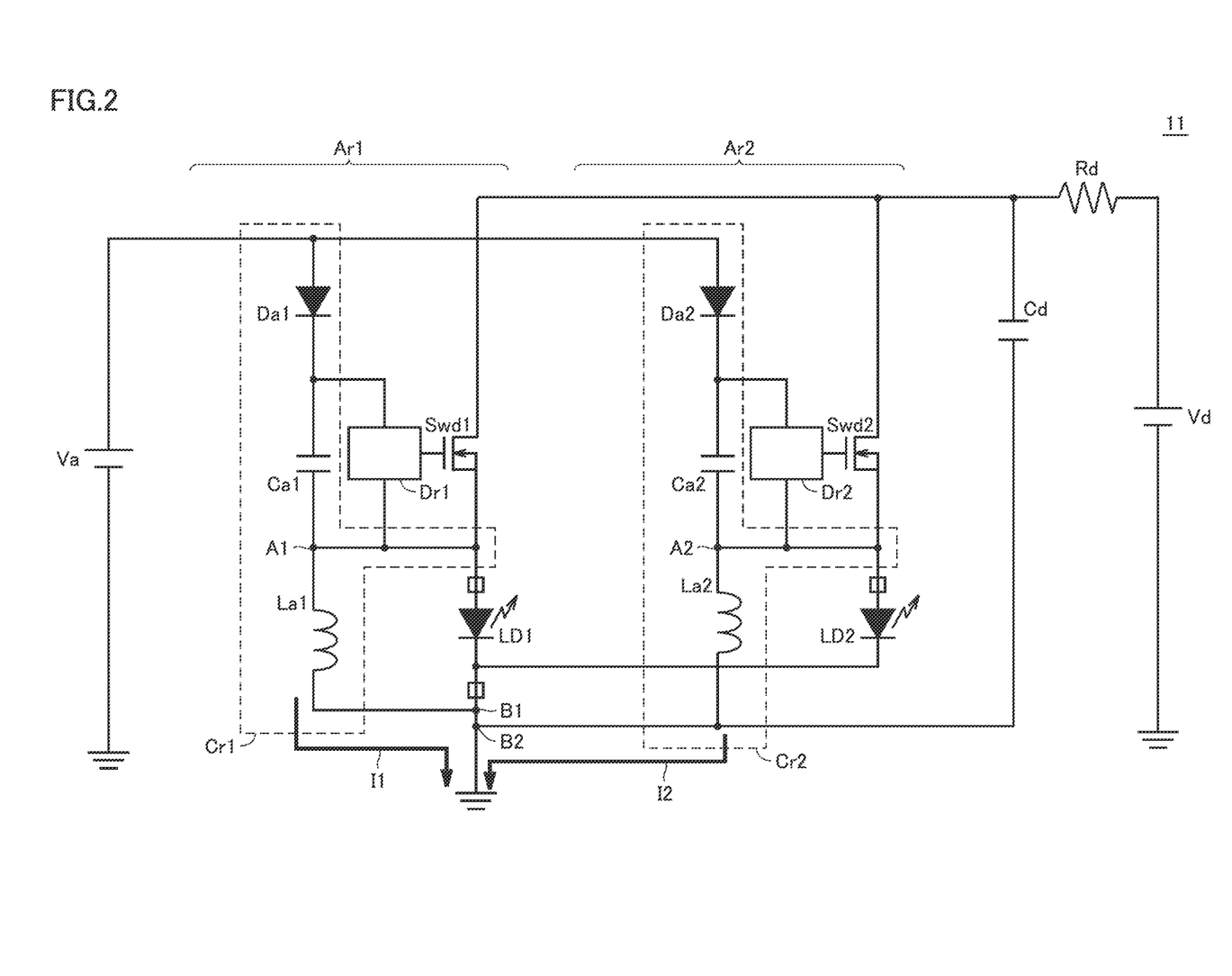
FIG. 2 is a circuit diagram showing a laser diode drive circuit in a modification of the first exemplary embodiment.

FIG. 2 is a circuit diagram showing a laser diode drive circuit 11 in a modification of the first exemplary embodiment. As shown, laser diode drive circuit 11 is different from laser diode drive circuit 10 in including a resistive element Rd. Resistive element Rd is provided to suppress an amount of charges supplied from driving power supply Vd to driving capacitor Cd during drive with pulses of laser diodes LD1 and LD2. In this aspect, resistive element Rd has one end connected to driving power supply Vd and the other end connected to driving capacitor Cd.

Thus, the current that flows from driving power supply Vd to driving capacitor Cd when driving switching elements Swd1 and Swd2 are set to the ON state and then charges stored in driving capacitor Cd are supplied to laser diodes LD1 and LD2 can be restricted, and laser diodes LD1 and LD2 can be driven with short pulses.

Figure 3:
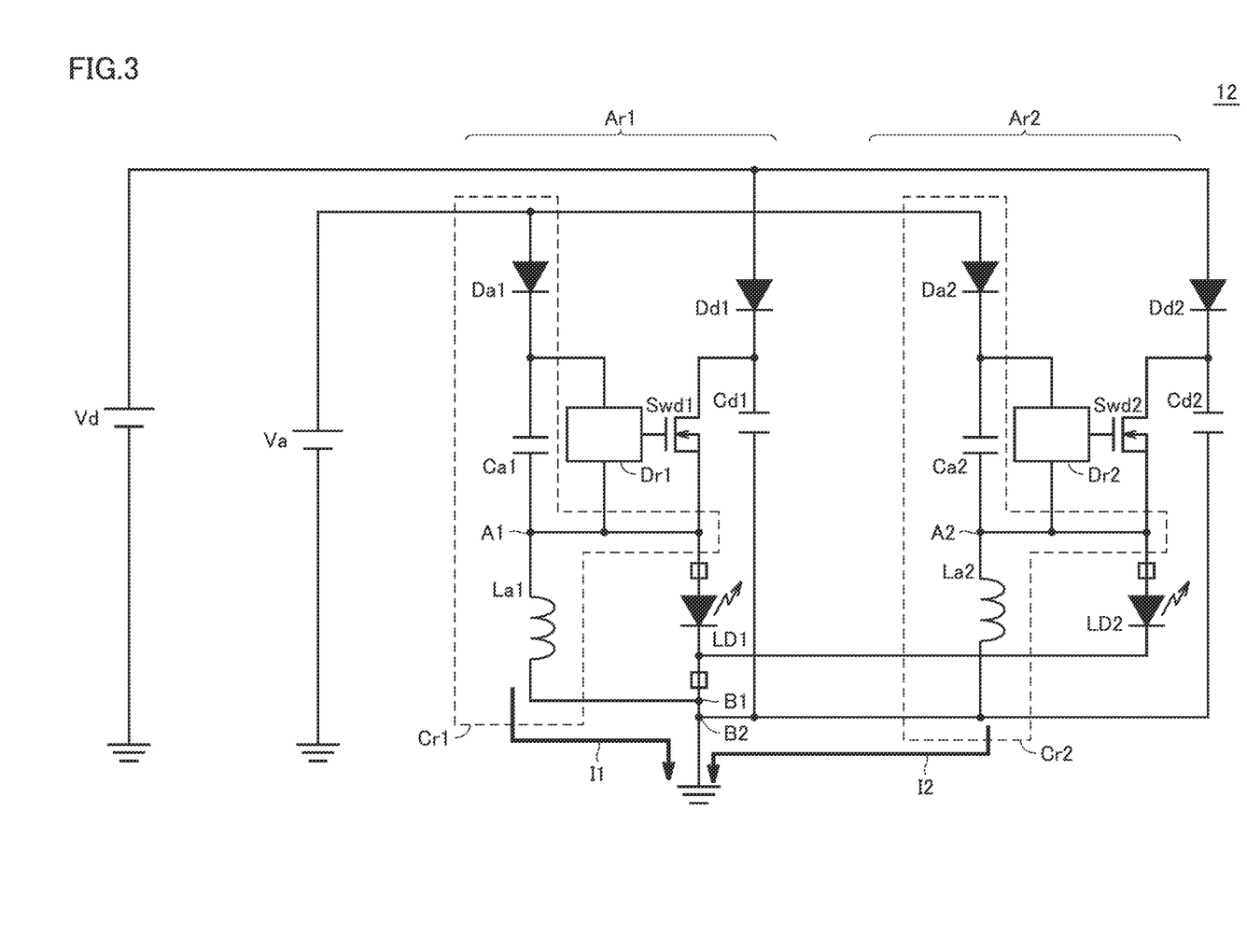
FIG. 3 is a circuit diagram showing a laser diode drive circuit in a modification of the first exemplary embodiment.

FIG. 3 is a circuit diagram showing a laser diode drive circuit 12 in a modification of the first exemplary embodiment. Laser diode drive circuit 12 is different from laser diode drive circuit 10 in that it includes driving capacitors Cd1 and Cd2 and current backflow prevention elements Dd1 and Dd2 for respective arms Ar1 and Ar2.

Charges supplied from driving power supply Vd are stored in driving capacitor Cd1, and driving capacitor Cd1 supplies the current to laser diode LD1. Similarly, charges supplied from driving power supply Vd are stored in driving capacitor Cd2, and driving capacitor Cd2 supplies the current to laser diode LD2. Driving capacitors Cd1 and Cd2 are provided between driving power supply Vd and the ground. Driving capacitors Cd1 and Cd2 have first ends connected to ends of driving switching elements Swd1 and Swd2, respectively.

Current backflow prevention elements Dd1 and Dd2 are diodes that prevent, when the current (charges) stored in driving capacitors Cd1 and Cd2 flows to laser diodes LD1 and LD2, the current from flowing to a laser diode connected to another arm. Driving power supply Vd is connected to anode sides of current backflow prevention elements Dd1 and Dd2, and driving capacitors Cd1 and Cd2 are connected to cathode sides of current backflow prevention elements Dd1 and Dd2, respectively.

While laser diodes LD1 and LD2 are driven (i.e., while driving switching elements Swd1 and Swd2 are in the ON state), a current may also flow to a laser diode other than a laser diode desired to emit light due to a parasitic capacitance, a parasitic inductance, or a parasitic resistance of driving switching elements Swd1 and Swd2, laser diodes LD1 and LD2, or an interconnection between components. In laser diode drive circuit 12, however, driving capacitors Cd1 and Cd2 and current backflow prevention elements Dd1 and Dd2 are provided for respective arms Ar1 and Ar2. Therefore, a flow of the current emitted from driving capacitors Cd1 and Cd2 to a laser diode in a different arm, in particular a laser diode not desired to emit light, is suppressed. Since current backflow prevention elements Dd1 and Dd2 should only be able to suppress a flow to a different arm, of the current emitted from driving capacitors Cd1 and Cd2, they may be resistive elements or inductors.

Figure 4:
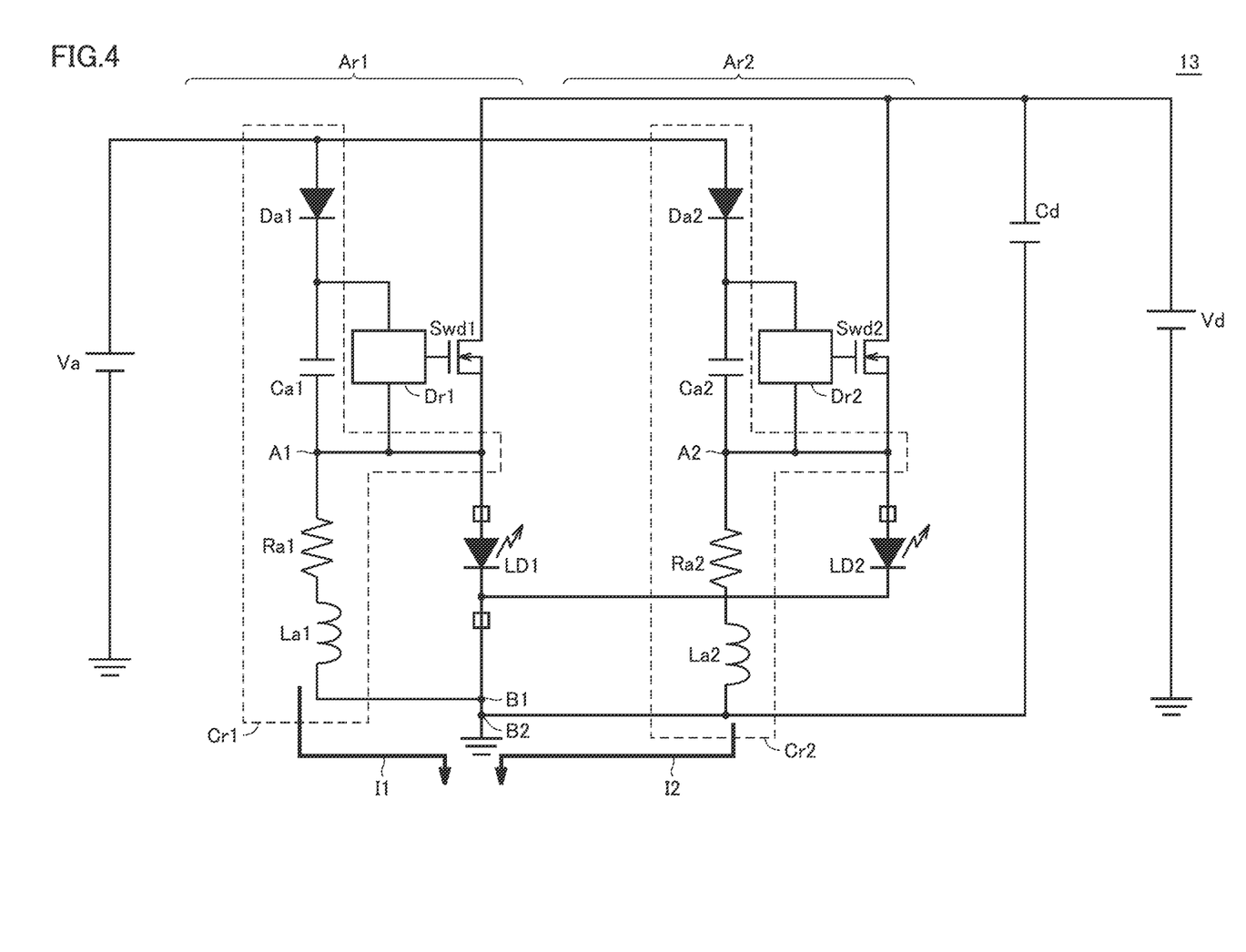
FIG. 4 is a circuit diagram showing a laser diode drive circuit in a modification of the first exemplary embodiment.

FIG. 4 is a circuit diagram showing a laser diode drive circuit 13 in a modification of the first exemplary embodiment. Laser diode drive circuit 13 is different from laser diode drive circuit 10 in that it includes resistive elements Ra1 and Ra2 for respective arms Ar1 and Ar2.

Resistive elements Ra1 and Ra2 are connected in series to capacitors Ca1 and Ca2 between capacitors Ca1 and Ca2 and the ground, respectively. In laser diode drive circuit 13, the pulse frequency of laser diodes LD1 and LD2 is within a range not lower than 100 MHz and not higher than 1 GHz and the emission frequency of laser diodes LD1 and LD2 is not higher than 500 kHz. In laser diode drive circuit 13, at the pulse frequency of laser diodes LD1 and LD2, absolute values of impedances of laser diodes LD1 and LD2 (an impedance of a path including laser diodes LD1 and LD2 between points of connection A1 and A2 and points of connection B1 and B2) are configured to be smaller than a value of the sum of the impedances of inductors La1 and La2 and the impedances of resistive elements Ra1 and Ra2.

In this aspect, with R representing resistance values of resistive elements Ra1 and Ra2, L representing inductances of inductors La1 and La2, fid representing a pulse frequency of laser diodes LD1 and LD2, fsw representing an emission frequency of laser diodes LD1 and LD2, and Zld representing impedances (an impedance of a path including laser diodes LD1 and LD2 between points of connection A1 and A2 and points of connection B1 and B2) of laser diodes LD1 and LD2, laser diode drive circuit 13 satisfies an expression 2 below.

$$|Zld| < 2\pi f l d \times L + R$$ (Expression 2)

During charging of capacitors Ca1 and Ca2, ringing (e.g., noise) may be produced between capacitors Ca1 and Ca2 and inductors La1 and La2. In laser diode drive circuit 13, by providing resistive elements Ra1 and Ra2 between capacitors Ca1 and Ca2 and inductors La1 and La2, respectively, ringing (e.g., noise) produced during charging of capacitors Ca1 and Ca2 can be suppressed.

Resistive elements Ra1 and Ra2 should only be connected in series to capacitors Ca1 and Ca2, respectively, and a position of connection does not have to be located between capacitors Ca1 and Ca2 and the ground.

Second Exemplary Embodiment

A laser diode drive circuit in a second embodiment will be described. In the first embodiment, inductors La1 and La2 are provided to suppress a flow of a current to laser diodes LD1 and LD2 during charging of capacitors Ca1 and Ca2. In contrast, in the second embodiment, a flow of the current during charging of the capacitor is controlled by means of a switching element. Components similar to those in the first embodiment have the same reference characters allotted and description thereof will not be repeated.

Figure 5:
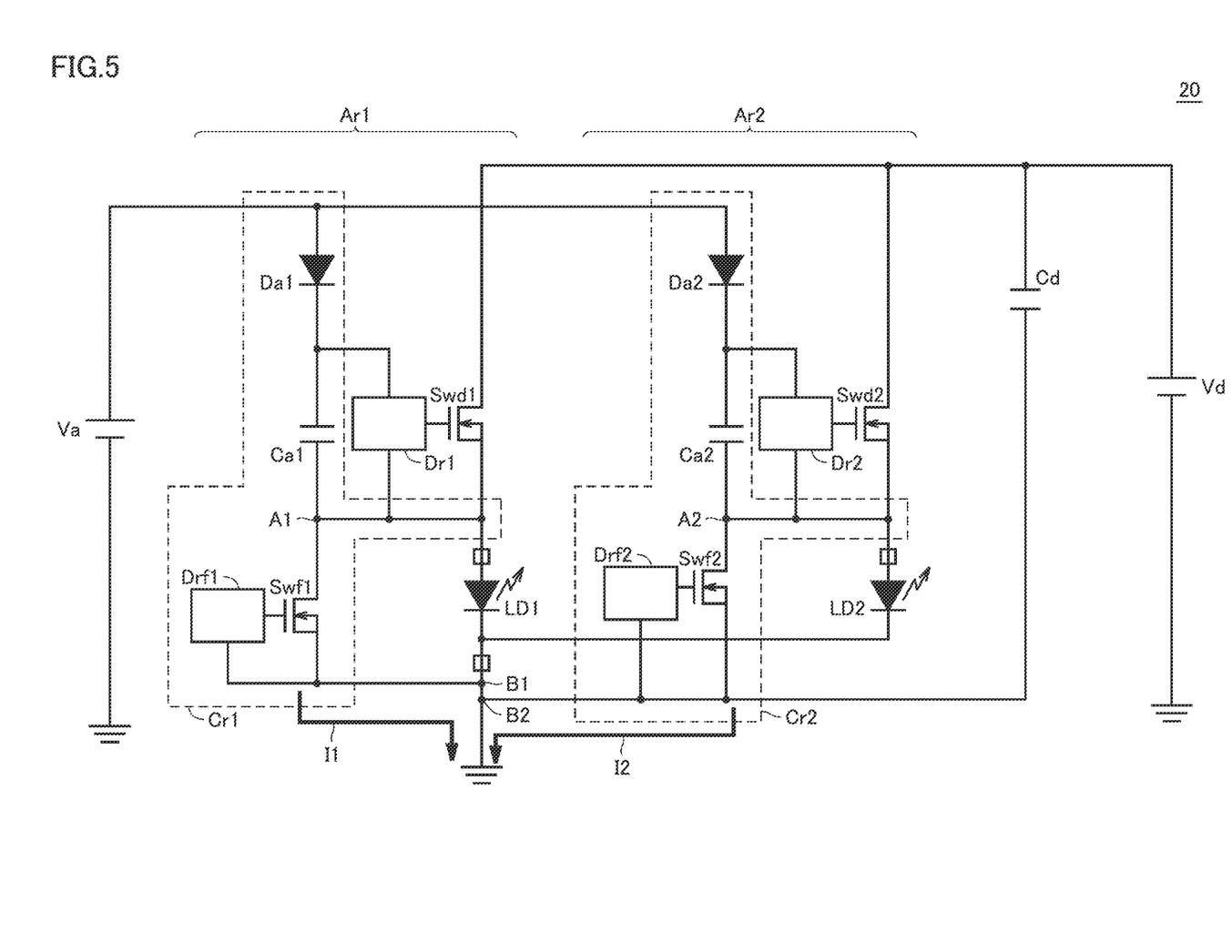
FIG. 5 is a circuit diagram showing a laser diode drive circuit in a second exemplary embodiment.
Figure 6:
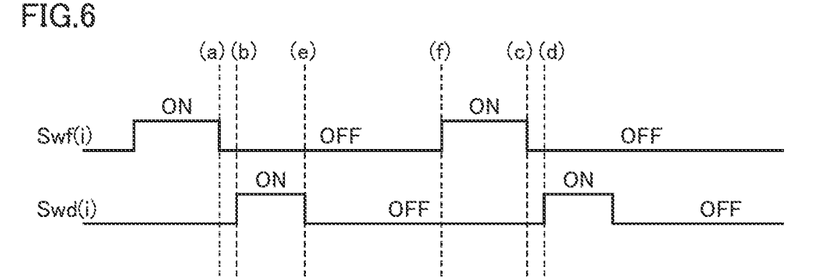
FIG. 6 is a timing chart showing timing of switching of a switching element and a driving switching element.

FIG. 5 is a circuit diagram showing a laser diode drive circuit 20 in the second embodiment. FIG. 6 is a timing chart showing timing of switching of switching elements Swf1 and Swf2 and driving switching elements Swd1 and Swd2.

Referring to FIG. 5, switching elements Swf1 and Swf2 instead of inductors La1 and La2 shown in the first embodiment are connected to laser diode drive circuit 20. Switching elements Swf1 and Swf2 are exemplary current suppression elements. While switching elements Swf1 and Swf2 are in the ON state, the current flows through switching elements Swf1 and Swf2, and while switching elements Swf1 and Swf2 are in the OFF state, the current does not flow through switching elements Swf1 and Swf2. Switching between ON and OFF of switching elements Swf1 and Swf2 is made by drive circuits Drf1 and Drf2. Switching elements Swf1 and Swf2 are controlled to the ON state while capacitors Ca1 and Ca2 are charged, and when charging of capacitors Ca1 and Ca2 is completed, they are controlled to the OFF state.

Referring to FIGS. 5 and 6, switching elements Swf1 and Swf2 (denoted as "Swf(i)" in FIG. 6 (i being an integer)) is controlled to the ON state at any timing during the period of the OFF state of driving switching elements Swd1 and Swd2 (denoted as "Swd(i)" in FIG. 6 (i being an integer)). When switching elements Swf1 and Swf2 are controlled to the ON state, currents I1 and I2 flow from drive circuit power supply Va through current backflow prevention elements Da1 and Da2, capacitors Ca1 and Ca2, and switching elements Swf1 and Swf2 to the ground so that capacitors Ca1 and Ca2 are charged. At this time, the current does not flow to laser diodes LD1 and LD2. After lapse of a sufficient time period for completion of charging of capacitors Ca1 and Ca2, switching elements Swf1 and Swf2 are controlled to the OFF state. Thereafter, driving switching elements Swd1 and Swd2 are controlled to the ON state for a required time period so that the current flows to laser diodes LD1 and LD2.

Timing (a) and timing (c) shown in FIG. 6 indicate timing of completion of charging of capacitors Ca1 and Ca2 (timing of switching of switching elements Swf1 and Swf2 from the ON state to the OFF state), and timing (b) and timing (d) shown in FIG. 6 indicate timing of switching of driving switching elements Swd1 and Swd2 from the OFF state to the ON state. Timing of switching of switching elements Swf1 and Swf2 from the ON state to the OFF state and timing of switching of driving switching elements Swd1 and Swd2 from the OFF state to the ON state are controlled not to coincide with each other. A period for which switching elements Swf1 and Swf2 are controlled to the ON state should only be sufficient for charging of capacitors Ca1 and Ca2. Moreover, a period for which driving switching elements Swd1 and Swd2 are controlled to the ON state should only be sufficient for having laser diodes LD1 and LD2 emit light. In FIG. 6, laser diode drive circuit 20 controls driving switching element Swd(i) and switching element Swf(i) such that timing (0 of switching of switching element Swf(i) from the OFF state to the ON state comes after timing (e) of switching of driving switching element Swd(i) from the ON state to the OFF state. When emission of pulses of light shorter than a period for which driving switching element Swd(i) is controlled to the ON state by laser diode Ld(i) (i being an integer) is desired, however, laser diode drive circuit 20 may control driving switching element Swd(i) and switching element Swf(i) such that timing (e) comes after timing (0. In other words, laser diode drive circuit 20 forcibly has charges in driving capacitor Cd released to the ground by setting switching element Swf(i) to the ON state in the middle of the period for which driving switching element Swd(i) is controlled to the ON state, so as to be able to realize pulses of light shorter than the period for which driving switching element Swd(i) is controlled to the ON state.

Thus, in charging of capacitors Ca1 and Ca2 (i.e., switching elements Swf1 and Swf2 being in the ON state and driving switching elements Swd1 and Swd2 being in the OFF state), the current flows to switching elements Swf1 and Swf2 and substantially no voltage is applied across the anode and the cathode of each of laser diodes LD1 and LD2. Therefore, laser diodes LD1 and LD2 do not emit light. Moreover, undesired light emission from laser diodes LD1 and LD2 can thus be suppressed.

In charging of capacitors Ca1 and Ca2 (i.e., switching elements Swf1 and Swf2 being in the ON state and driving switching elements Swd1 and Swd2 being in the OFF state), the current flows to switching elements Swf1 and Swf2 and substantially no voltage is applied across the anode and the cathode of each of laser diodes LD1 and LD2. Therefore, a voltage substantially as high as drive circuit power supply Va is applied across the opposing ends of each of capacitors Ca1 and Ca2. A high voltage necessary for driving the driving switching elements Swd1 and Swd2 can thus be secured. Therefore, when driving switching elements Swd1 and Swd2 are set to the ON state, a high current can abruptly flow to laser diodes LD1 and LD2.

When laser diodes LD1 and LD2 are driven (i.e., switching elements Swf1 and Swf2 being in the OFF state and driving switching elements Swd1 and Swd2 being in the ON state), the current flows from driving capacitor Cd through driving switching elements Swd1 and Swd2 to laser diodes LD1 and LD2, and does not flow to switching elements Swf1 and Swf2.

Laser diodes LD1 and LD2 emit light by switching of driving switching elements Swd1 and Swd2 from the OFF state to the ON state. By switching a driving switching element corresponding to a laser diode desired to emit light at timing at which light emission therefrom is desired from the OFF state to the ON state, the laser diode desired to emit light at timing at which light emission therefrom is desired can individually be controlled to emit light.

In general, it is noted that although two laser diodes (e.g., laser diodes LD1 and LD2) are connected to laser diode drive circuit 20, at least one laser diode should only be connected and an arm is provided for each connected laser diode.

A modification of the second embodiment will be described with reference to FIGS. 7 and 8. Components similar to those in the first or second embodiment have the same reference characters allotted and description thereof will not be repeated.

Figure 7:
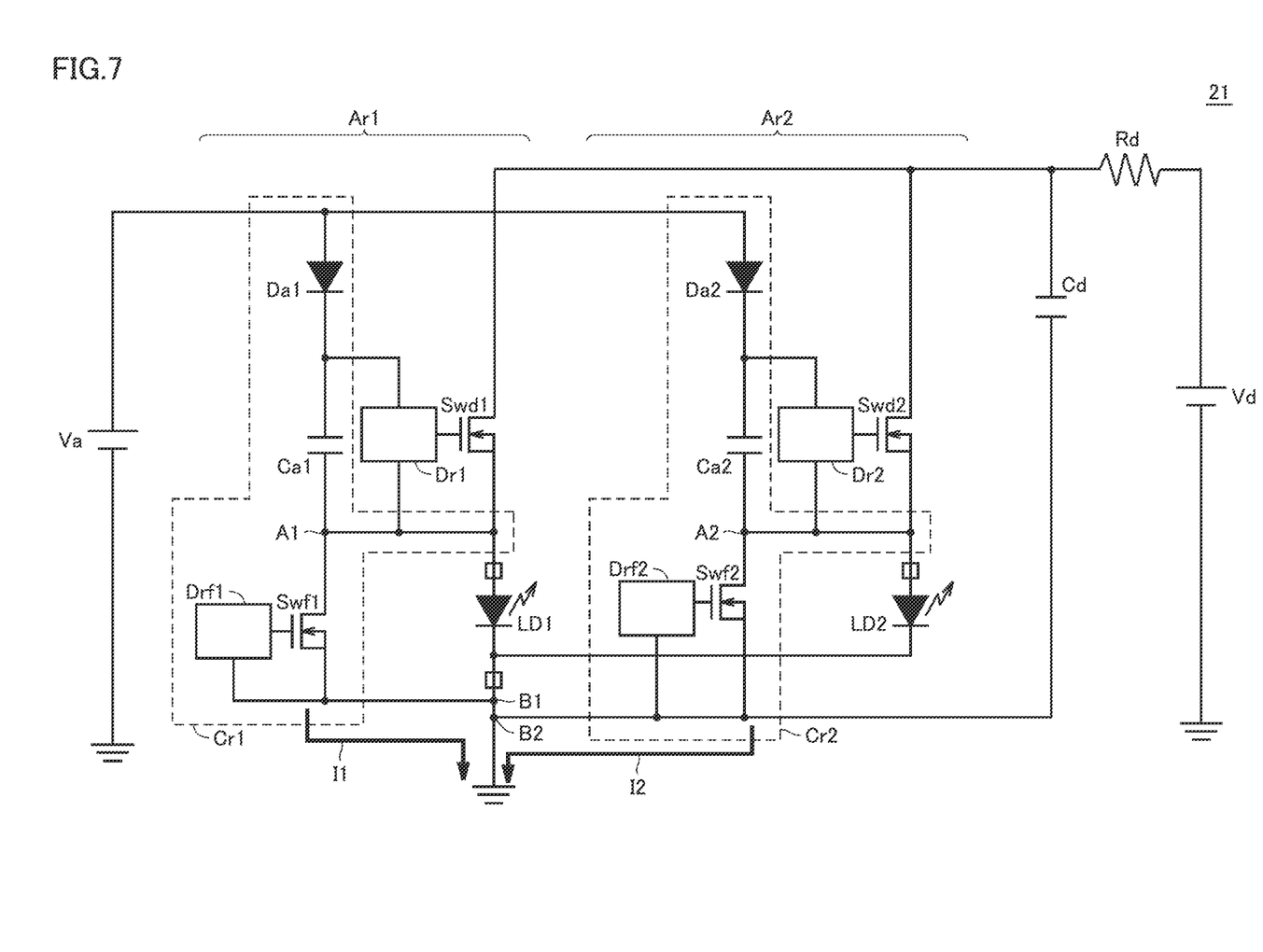
FIG. 7 is a circuit diagram showing a laser diode drive circuit in a modification of the second exemplary embodiment.

FIG. 7 is a circuit diagram showing a laser diode drive circuit 21 in a modification of the second exemplary embodiment. Laser diode drive circuit 21 is different from laser diode drive circuit 20 in including resistive element Rd. Resistive element Rd suppresses an amount of charges supplied from driving power supply Vd to driving capacitor Cd during drive with pulses of laser diodes LD1 and LD2. Resistive element Rd has one end connected to driving power supply Vd and the other end connected to driving capacitor Cd.

Thus, the current that flows from driving power supply Vd to driving capacitor Cd when driving switching elements Swd1 and Swd2 are set to the ON state and then charges stored in driving capacitor Cd are supplied to laser diodes LD1 and LD2 can be restricted, and laser diodes LD1 and LD2 can be driven with short pulses.

Figure 8:
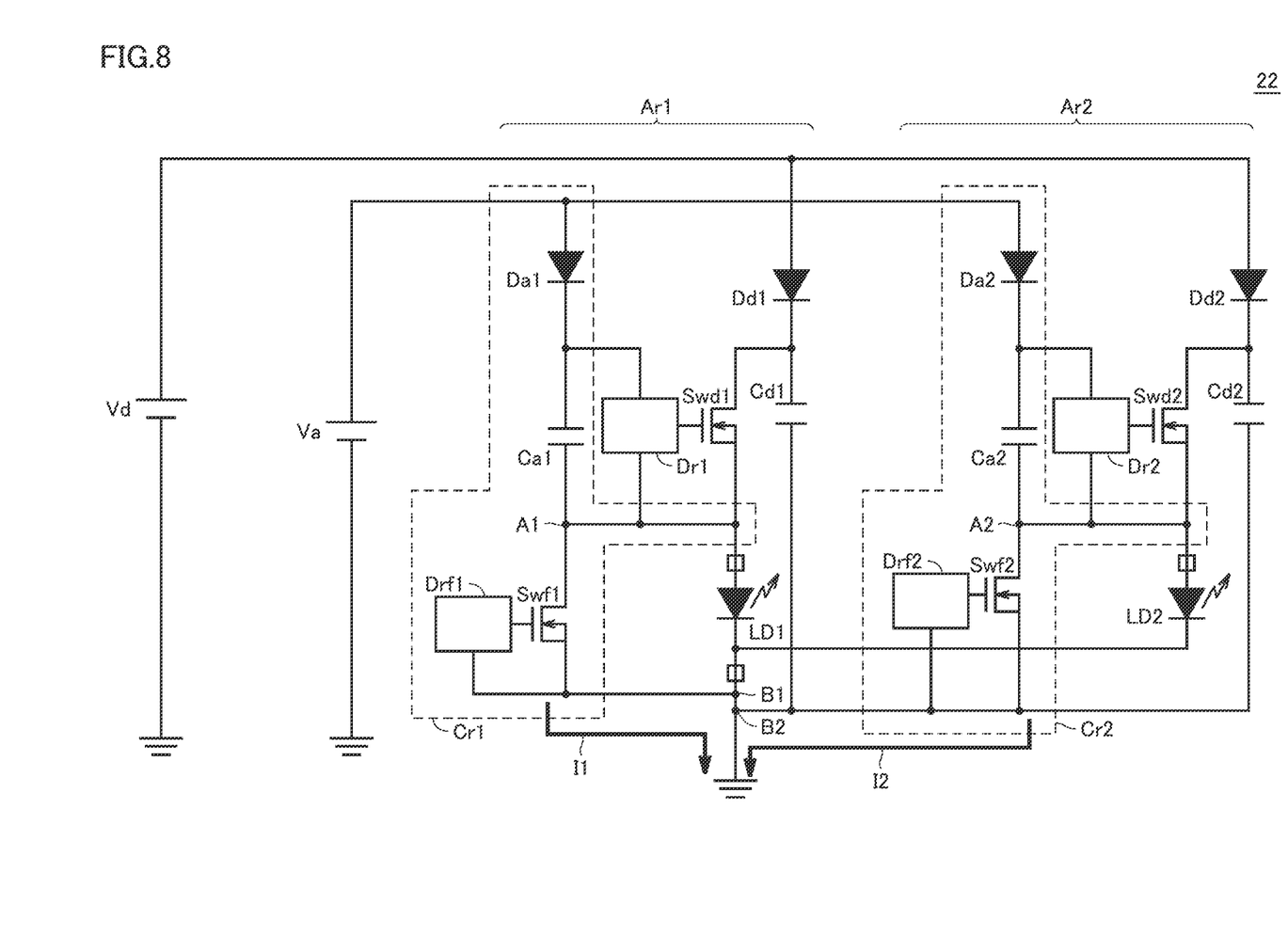
FIG. 8 is a circuit diagram showing a laser diode drive circuit in a modification of the second exemplary embodiment.

FIG. 8 is a circuit diagram showing a laser diode drive circuit 22 in a modification of the second embodiment. Laser diode drive circuit 22 is different from laser diode drive circuit 20 in including driving capacitors Cd1 and Cd2 and current backflow prevention elements Dd1 and Dd2 for respective arms Ar1 and Ar2.

Charges supplied from driving power supply Vd are stored in driving capacitor Cd1, and driving capacitor Cd1 supplies the current to laser diode LD1. Similarly, charges supplied from driving power supply Vd are stored in driving capacitor Cd2, and driving capacitor Cd2 supplies the current to laser diode LD2. Driving capacitors Cd1 and Cd2 are provided between driving power supply Vd and the ground. Driving capacitors Cd1 and Cd2 have first ends connected to ends of driving switching elements Swd1 and Swd2, respectively.

Current backflow prevention elements Dd1 and Dd2 are diodes that prevent, when the current (charges) stored in driving capacitors Cd1 and Cd2 flows to laser diodes LD1 and LD2, the current from flowing to a laser diode connected to another arm. Driving power supply Vd is connected to the anode sides of current backflow prevention elements Dd1 and Dd2, and driving capacitors Cd1 and Cd2 are connected to the cathode sides of current backflow prevention elements Dd1 and Dd2, respectively.

While laser diodes LD1 and LD2 are driven (i.e., while driving switching elements Swd1 and Swd2 are in the ON state), a current may flow also to a laser diode other than a laser diode desired to emit light due to a parasitic capacitance, a parasitic inductance, or a parasitic resistance of driving switching elements Swd1 and Swd2, laser diodes LD1 and LD2, or an interconnection between components. In laser diode drive circuit 22, however, driving capacitors Cd1 and Cd2 and current backflow prevention elements Dd1 and Dd2 are provided for respective arms Ar1 and Ar2. Therefore, a flow of the current emitted from driving capacitors Cd1 and Cd2 to a laser diode in a different arm (a laser diode not desired to emit light) can be suppressed. Since current backflow prevention elements Dd1 and Dd2 should only be able to suppress a flow of the current emitted from driving capacitors Cd1 and Cd2 to a different arm, they may be resistive elements or inductors.

[Additional Modifications of the Exemplary Embodiments]

For the laser diode drive circuits described above, configurations for light emission from two laser diodes LD1 and LD2 are described. A configuration for light emission from three or more laser diodes can also similarly be applied. For example, in a laser diode drive circuit that drives n laser diodes LD1, LD2, LDn, inductors La1, La2, . . . , Lan are connected between points of connection A1, A2, . . . , An and points of connection B1, B2, Bn. Relation between an inductance of each inductor and an impedance of each laser diode satisfies an expression 3 below. L(i) represents an inductance of each inductor La(i) and Zld(i) represents an impedance of each laser diode LD(i), i being an integer from 1 to n.

$$|Zld(i)|<2\pi fld \times L(i) \quad \text{(Expression 3)}$$

Inductance L(i) of inductor La(i) has such a value that the current that flows to laser diode Ld(i) during charging of capacitor Ca(i) is smaller than an amount of current necessary for light emission from laser diode Ld(i).

A configuration of the laser diode drive circuit in which a resistive element is connected in series to each of inductors La1, La2, . . . , Lan can also similarly be applied. In this case, relation between the inductance of each inductor and the impedance of each laser diode satisfies an expression 4 below. R(i) represents a resistance value of each resistive element Ra(i), i being an integer from 1 to n.

$$|Zld(i)|<2\pi fld \times L(i)+R(i) \quad \text{(Expression 4)}$$

In general, it should be understood that the embodiments disclosed herein are illustrative and non-restrictive in every respect.

REFERENCE SIGNS LIST 10, 11, 12, 13, 20, 21, 22 laser diode drive circuit; Ar1, Ar2 arm; Ca1, Ca2 capacitor; Cd, Cd1, Cd2 driving capacitor; Cr1, Cr2 boot strap circuit; Da1, Da2, Dd1, Dd2 current backflow prevention element; Dr1, Dr2, Drf1, Drf2 drive circuit; LD1, LD2 laser diode; La1, La2 inductor; Ra1, Ra2, Rd resistive element; Swd1, Swd2 driving switching element; Swf1, Swf2 switching element; Va drive circuit power supply; Vd driving power supply

The invention claimed is:

1. A laser diode drive circuit comprising:
at least one laser diode;
a driving switching element connected in series to an anode side of the at least one laser diode and configured to switch between an ON state in which a current is supplied to the at least one laser diode and an OFF state in which the current is not supplied to the at least one laser diode;
a driving capacitor having a first end connected to the driving switching element and configured to supply a current to the at least one laser diode;
a drive circuit configured to drive the driving switching element; and
a boot strap circuit configured to supply a voltage to the drive circuit for driving the driving switching element, with the boot strap circuit including:

a capacitor connected to the drive circuit having a first end connected to a source electrode of the driving switching element and a second end connected to a gate electrode of the driving switching element, and a current suppression element connected to the first end of the capacitor and configured to suppress a flow of a current that flows to the capacitor and to the at least one laser diode connected in parallel during a charging of the capacitor.

2. The laser diode drive circuit according to claim 1, wherein the capacitor is configured to be charged with prescribed charges.

3. The laser diode drive circuit according to claim 1, wherein the current suppression element is an inductor.

4. The laser diode drive circuit according to claim 3, wherein the at least one laser diode has an impedance with an absolute value that is smaller than a value of an impedance of the inductor at a pulse frequency of the at least one laser diode.

5. The laser diode drive circuit according to claim 3, wherein the at least one laser diode has a pulse frequency within a range not lower than 100 MHz and not higher than 1 GHz, and the at least one laser diode has an emission frequency not higher than 500 kHz.

6. The laser diode drive circuit according to claim 3, wherein the boot strap circuit further includes a resistive element connected in series to the capacitor.

7. The laser diode drive circuit according to claim 6, wherein at a pulse frequency of the at least one laser diode, the at least one laser diode has an impedance at an absolute value that is smaller than a value of a sum of an impedance of the inductor and an impedance of the resistive element.

8. The laser diode drive circuit according to claim 6, wherein the at least one laser diode has a pulse frequency within a range not lower than 100 MHz and not higher than 1 GHz, and the at least one laser diode has an emission frequency not higher than 500 kHz.

9. The laser diode drive circuit according to claim 1, wherein the current suppression element is a switching element.

10. The laser diode drive circuit according to claim 1, wherein the driving capacitor is a common capacitor that is configured to supply a current to a plurality of laser diodes including the at least one laser diode.

11. The laser diode drive circuit according to claim 1, wherein the driving capacitor comprises a plurality of individual capacitors that are configured to supply currents to a plurality of laser diodes, respectively, including the at least one laser diode.

12. The laser diode drive circuit according to claim 1, further comprising a current backflow prevention element configured to prevent a current from flowing to an additional laser diode when the current stored in the driving capacitor flows to the at least one laser diode.

13. The laser diode drive circuit according to claim 12, wherein the current backflow prevention element is a diode configured to prevent the current from flowing toward the additional laser diode.

14. The laser diode drive circuit according to claim 1, further comprising a resistive element coupled to the driving capacitor and configured to suppress an amount of charges supplied from a driving power supply to the driving capacitor.

15. A laser diode drive circuit comprising:
a plurality of laser diodes;
a plurality of driving switching elements connected in series to the plurality of laser diodes, respectively, and each configured to switch between an ON state in which a current is supplied to the respective laser diode and an OFF state in which the current is not supplied to the respective laser diode;
a driving capacitor having a first end connected to each of the plurality of driving switching elements and configured to supply a current thereto;
at least one drive circuit configured to drive the plurality of driving switching element; and
a plurality of boot strap circuits each configured to supply a voltage to the at least one drive circuit for driving the plurality of driving switching elements,
wherein each of the plurality of boot strap circuits includes a capacitor connected in parallel to the at least one drive circuit, and a current suppression element connected to the capacitor and configured to suppress a flow of a current to the capacitor and to the respective laser diode during a charging of the capacitor.

16. The laser diode drive circuit according to claim 15, wherein the current suppression element of each of the plurality of boot strap circuits is an inductor.

17. The laser diode drive circuit according to claim 16, wherein each of the plurality of laser diodes has an impedance with an absolute value that is smaller than a value of an impedance of the inductor at a pulse frequency of the respective laser diode.

18. The laser diode drive circuit according to claim 16, wherein each of the plurality of laser diode has a pulse frequency within a range not lower than 100 MHz and not higher than 1 GHz, and each of the plurality of laser diodes has an emission frequency not higher than 500 kHz.

19. The laser diode drive circuit according to claim 15, wherein each of the plurality boot strap circuits further includes a resistive element connected in series to the capacitor, respectively.

20. The laser diode drive circuit according to claim 19, wherein at a pulse frequency of each of the plurality of laser diodes, the respective laser diode has an impedance at an absolute value that is smaller than a value of a sum of an impedance of the inductor and an impedance of the resistive element.

* * * * *